United States Patent
Ikeda

(10) Patent No.: US 7,009,730 B2
(45) Date of Patent: Mar. 7, 2006

(54) IMAGE FORMING APPARATUS

(75) Inventor: Taro Ikeda, Shizouka (JP)

(73) Assignee: Canon Kabushiki Kaisha, Tokyo (JP)

( * ) Notice: Subject to any disclaimer, the term of this patent is extended or adjusted under 35 U.S.C. 154(b) by 866 days.

(21) Appl. No.: 09/866,664

(22) Filed: May 30, 2001

(65) Prior Publication Data

US 2002/0015294 A1    Feb. 7, 2002

(30) Foreign Application Priority Data

Jun. 1, 2000    (JP) .............................. 2000-164125

(51) Int. Cl.
*H01R 4/58* (2006.01)
*H01R 4/00* (2006.01)

(52) U.S. Cl. .......................... 358/1.7; 399/4; 257/676

(58) Field of Classification Search ................. 346/67, 346/154, 160, 76; 400/175; 399/20, 4; 248/49, 248/68.1; 235/462.42; 358/1.7, 1.8, 1.4; 257/676; 362/612, 555; 439/92

See application file for complete search history.

(56) References Cited

U.S. PATENT DOCUMENTS

| | | | | |
|---|---|---|---|---|
| 4,727,805 A | * | 3/1988 | Pichler et al. | ........... 101/93.04 |
| 5,200,763 A | * | 4/1993 | Tanuma et al. | ............. 347/237 |
| 5,798,483 A | * | 8/1998 | Nishitani et al. | ............. 174/51 |
| 6,268,566 B1 | * | 7/2001 | Takiguchi et al. | ........ 174/72 A |
| 6,280,208 B1 | * | 8/2001 | Masuda et al. | ............... 439/98 |

* cited by examiner

*Primary Examiner*—King Y. Poon
(74) *Attorney, Agent, or Firm*—Fitzpatrick, Cella, Harper & Scinto

(57) ABSTRACT

If an edge of a sheet metal of a image forming apparatus damages an electric cable, the image signal is distorted and no correct image is formed since the damage causes feeding failure and signal deterioration. This is remarkable in the conventional digital electrophotographic apparatus, since the drive signal to drive a laser or a light emitting diode (LED) for exposing the photosensitive body becomes higher in frequency as a resolution and speed are increased and tends to generate the electric noise. In order to prevent damage of an electric cable by a metal frame, an apparatus having a holder for holding a feed cable is provided.

7 Claims, 7 Drawing Sheets

IMAGE FORMING APPARATUS

BACKGROUND OF THE INVENTION

1. Field of the Invention

The present invention relates to an image forming apparatus such as a copying machine, facsimile apparatus and the like.

2. Related Background Art

In general, an image forming apparatus of an electrophotographic system forms an electrostatic latent image by exposing a charged photosensitive body to an image light, and after this electrostatic latent image is developed, it is transferred on a recording medium such as a paper or the like.

In such an image forming apparatus, an electric cable is used for feeding and transmitting a signal, and the cable is usually fixed to a sheet metal frame of the apparatus body.

As miniaturization of the apparatus has been progressing, restriction has come to be imposed on a wiring position and fixing position of the cable and sometimes the cable may come into contact with an edge of the metal frame.

In this case, since the edge of the sheet metal frame is sharp, the electric cable may be damaged, thereby causing feeding failure and signal deterioration.

Hence, a resin block is attached to the frame and the cable is fixed to this resin block, so that the cable can be prevented from contacting the edge.

However, since the resin block has an electric non-conductance, there arose a problem that an electric noise is generated when the cable transmits a high frequency.

Particularly, in a digital electrophotographic apparatus, the drive signal to drive a laser or a light emitting diode (LED) for exposing the photosensitive body becomes higher in frequency as a resolution and speed are increased and tends to generate the electric noise.

When this noise is superposed on an image signal, the image signal is distorted and an incorrect image is formed.

SUMMARY OF THE INVENTION

An object of the present invention is to provide an image forming apparatus which prevents the damage of an electric cable by a metal frame.

Another object of the present invention is to provide an image forming apparatus in which the electric cable can be installed.

Yet another object of the present invention is to provide an image forming apparatus as described in the claims.

Yet further objects of the present invention will be apparent from the following description.

DETAILED DESCRIPTION OF THE PREFERRED EMBODIMENTS

The present invention will be described in detail below with reference to the drawings.

First, an embodiment of the present invention will be described.

In the first place, an image forming process in the image forming apparatus adapting the electrophotographic system which is one example of the image forming apparatus according to the present embodiment will be explained with reference to FIG. 1.

Figure 1:
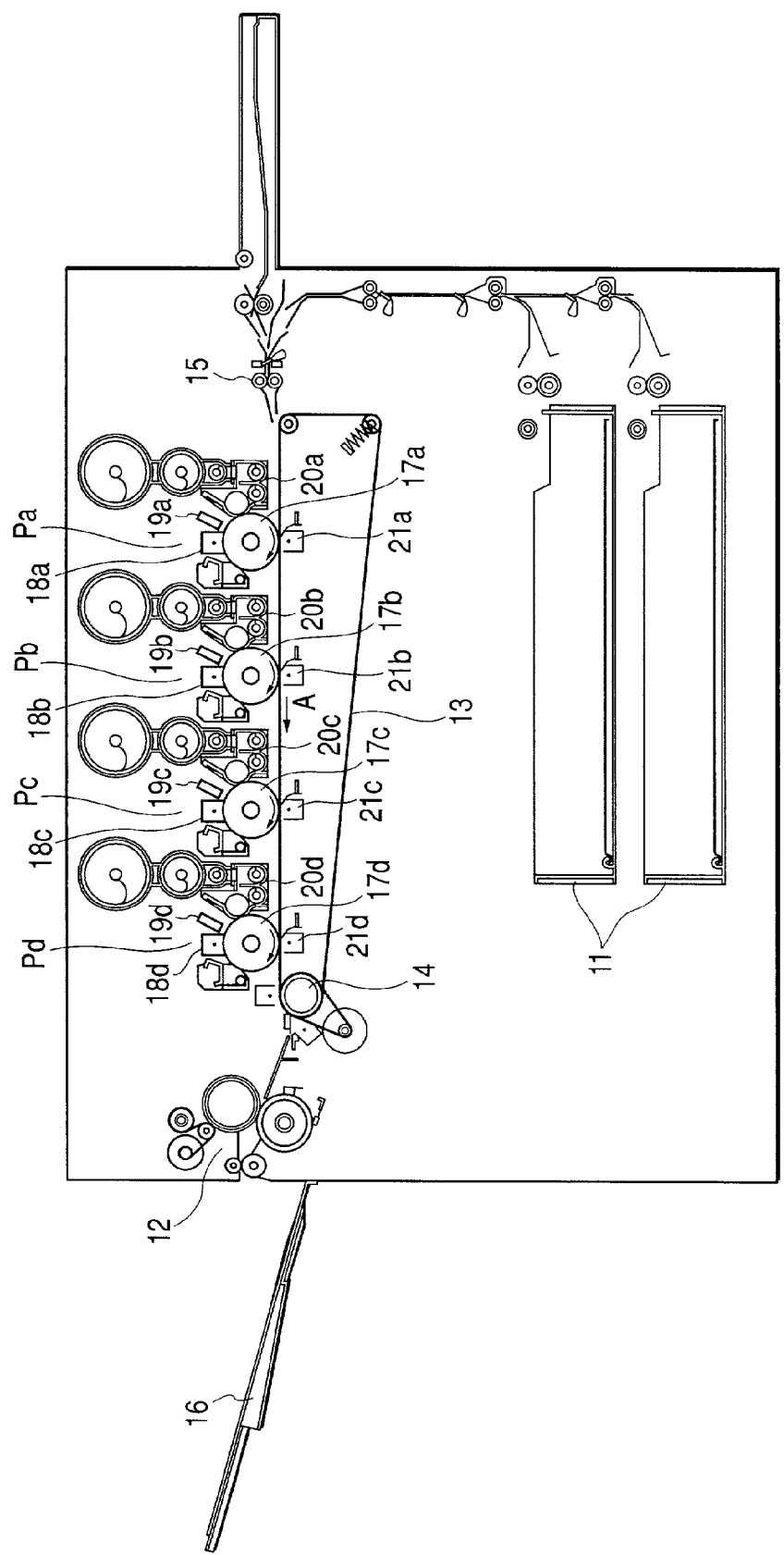
FIG. 1 is a cross-sectional view of a schematic configuration of an image forming apparatus according to an embodiment of the present invention.

In such an image forming apparatus, as shown in FIG. 1, first, second, third and fourth image forming sections Pa, Pb, Pc and Pd, which form images of respective colors of yellow, magenta, cyan and black, are installed. The image forming sections Pa, Pb, Pc and Pd comprise photosensitive drums 17a to 17d which are image bearing bodies respectively, and on which, after being evenly charged by charging means 18a to 18d, electrostatic latent images are formed by electrostatic latent image forming means 19a to 19d which use the light emitting diode as an exposure light source. After that, the electrostatic latent images are developed by the toners of various colors by developing means 20 to 20d, and the toner images are electrostatically transferred on a recording medium by transfer means 21a to 21d and then the toner images are fixed on the recording medium by heat and pressure of fixing means 12.

Under the above described first, second, third and fourth image forming sections Pa, Pb, Pc and Pd from a cassette 11 which stores recording papers as the recording medium to the fixing apparatus 12, a recording paper conveying belt as recording paper conveying means (hereinafter simply referred to as conveying belt) 13 in the shape of an endless belt which circularly moves through these image forming sections to convey the recording papers is installed.

The conveying belt 13 is a belt endlessly driven in the direction indicated by an arrow A by a drive roller 14 and bears the recording papers which are supplied from the cassette 11 and synchronized by a pair of registration rollers 15 and fed and conveyed in order to the above described image forming sections Pa, Pb, Pc and Pd.

The fixing apparatus 12 receives the recording paper discharged from the drive roller 14 side and collectively fixes the toner images of each color, which are superposed and transferred on the recording paper in the image forming sections Pa, Pb, Pc and Pd, on the above described recording paper and forms a permanent image, and thereafter discharges the above described recording paper to a discharge tray 16.

Figure 2:
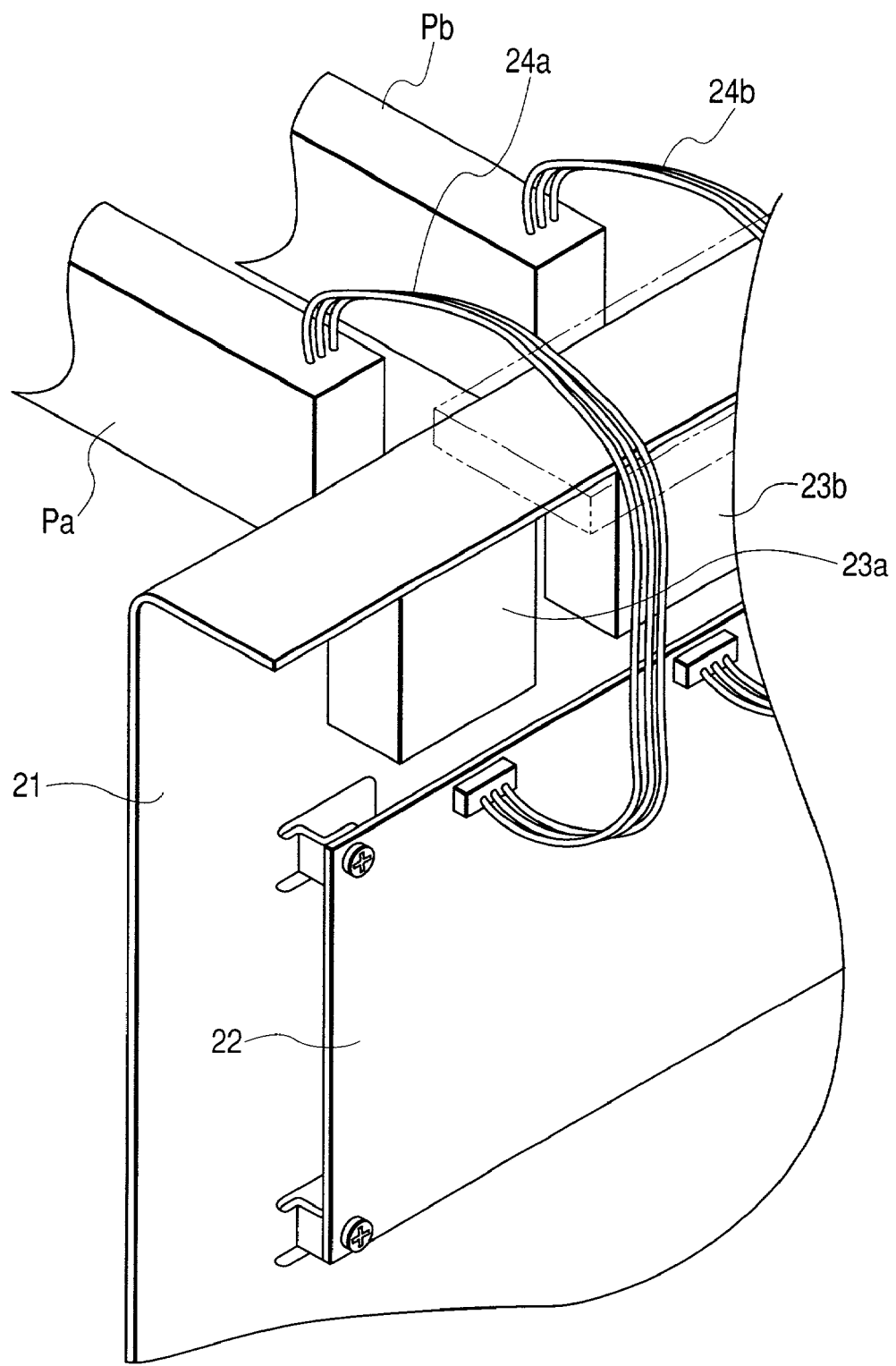
FIG. 2 is a view showing a wiring of a feed cable provided for the image forming apparatus.

A control line for electrically controlling the photosensitive drums 17a to d and the electrostatic latent image forming means 19a to d and the like of the above described image forming sections Pa, Pb, Pc and Pd and a feed cable 24 which is a power source line for supplying an electric power to the image forming sections Pa, Pb, Pc and Pd finally reach, as shown in FIG. 2, the power source (not shown) and a control substrate 22 through the metal frame. These power source and control substrate 22 are usually installed at the rear of the apparatus. In the vicinity of the image forming sections, driving sources 23a and 23b are installed respectively. In the case where these driving sources 23a and 23b avoid the metal frame 21 and try to secure a passage for the feed cable 24, a wiring passage inevitably becomes long. Particularly in the case of the present embodiment such as the image forming apparatus comprising four image forming sections, the installation of the feed cable 24 is complicated. In order to make the wiring passage of the feed cable 24 the shortest, it is desirable to take out the feed cable 24 from the position close to the rear of the metal frame 21 in the image forming sections.

However, if the feed cable 24 is attached to the metal frame 21 as it is, the edge of the metal frame 21 inflicts damage to the feed cable 24.

Figure 7:
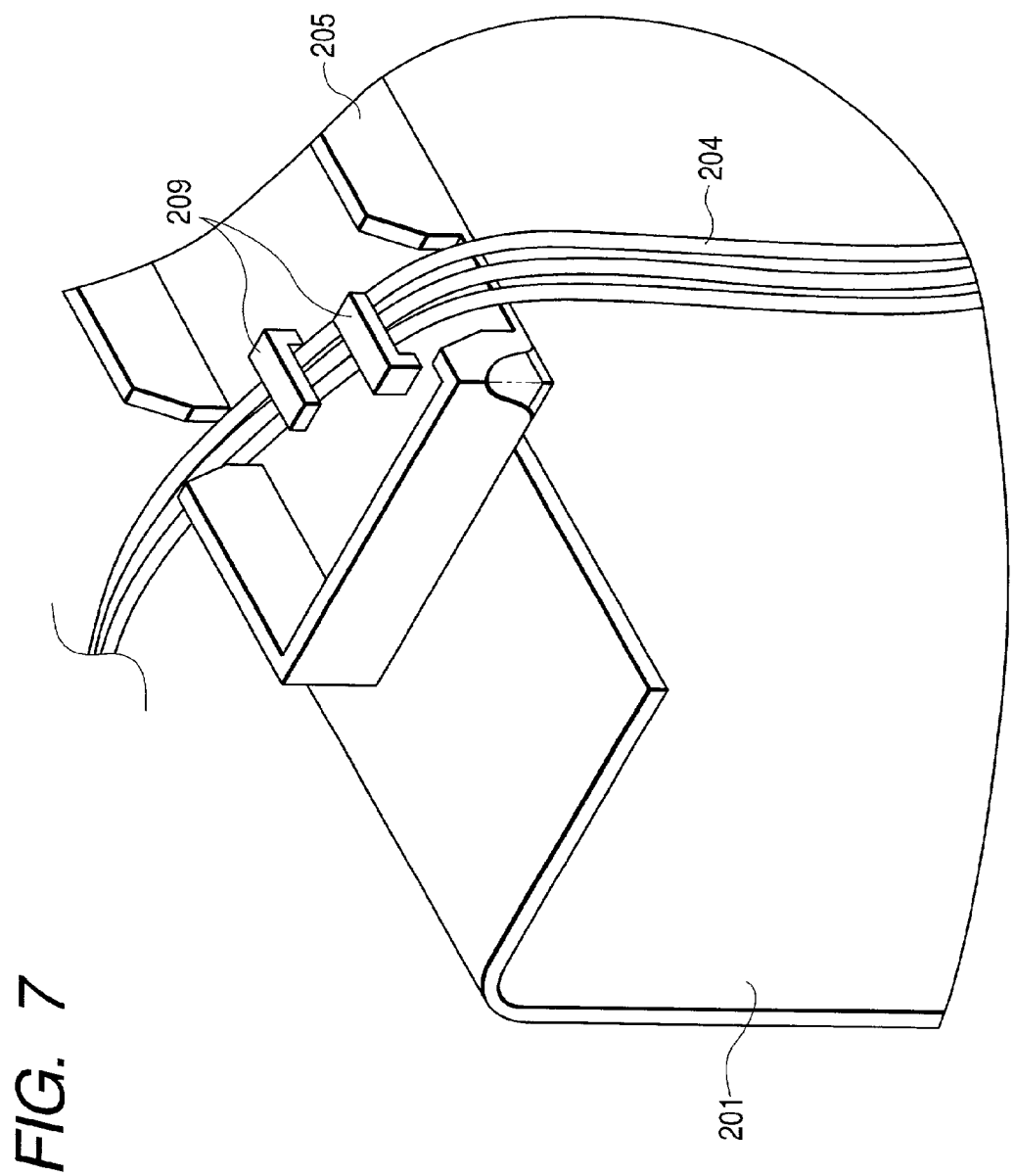
FIG. 7 is a prototype of an electric non-conductance resin holder built by the present inventor.

Therefore, the present inventor attached a holder 205 (FIG. 7) made of electric non-conductance resin to the metal frame 201, which protects and holds the feed cable 204. Nevertheless, since the feed cable 204 has been transmitting high frequency electric signals, electric noises were produced, which were superposed on the high frequency electric signals, thereby disturbing the images.

Figure 3:
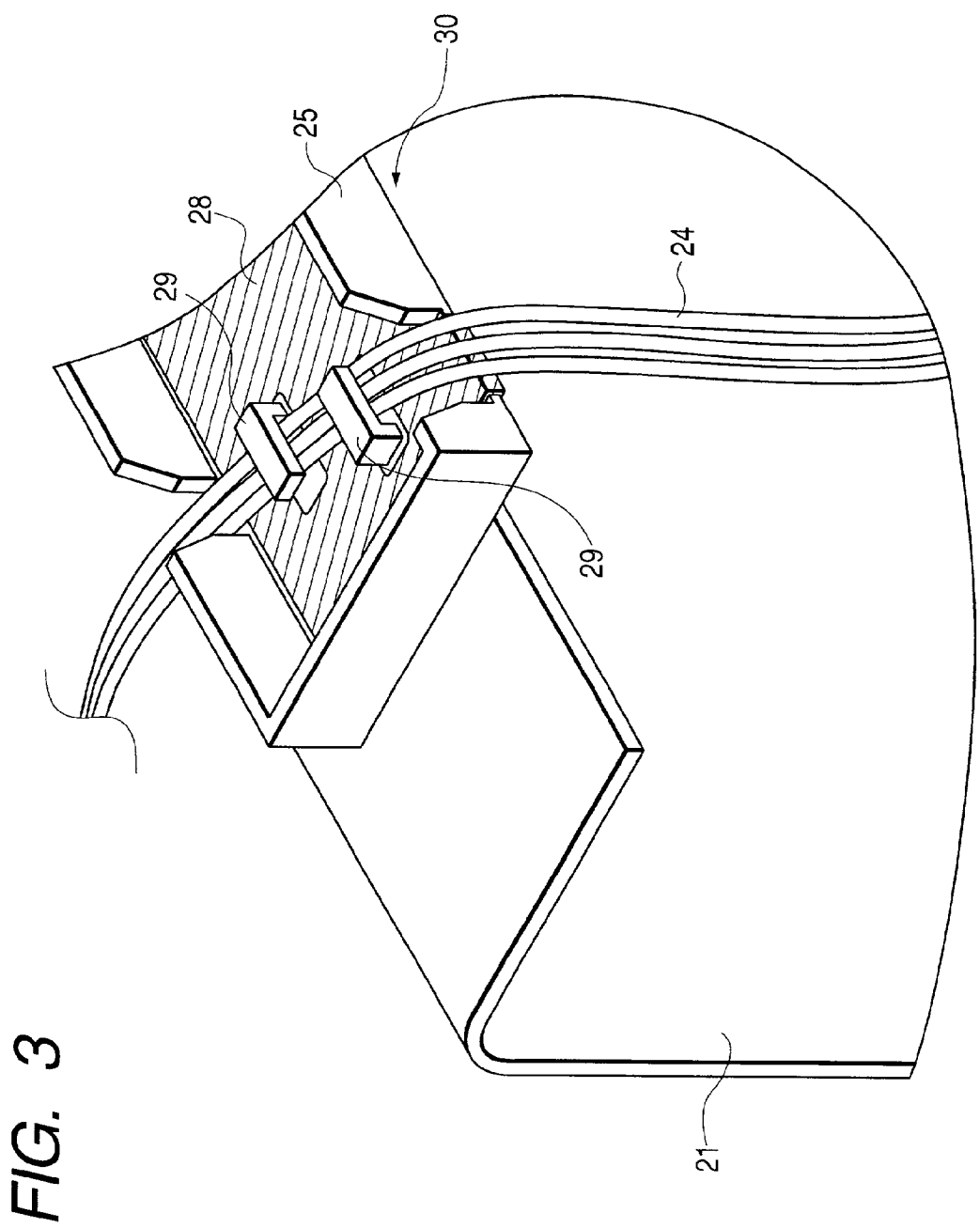
FIG. 3 is a schematic view of a holder of the embodiment of the present invention.

In view of the above, the present inventor has attached, as shown in FIG. 3, a holder 30 comprising a substrate 25 made of resin and an electro-conductive sheet 28 to the metal frame 21.

Figure 4A:
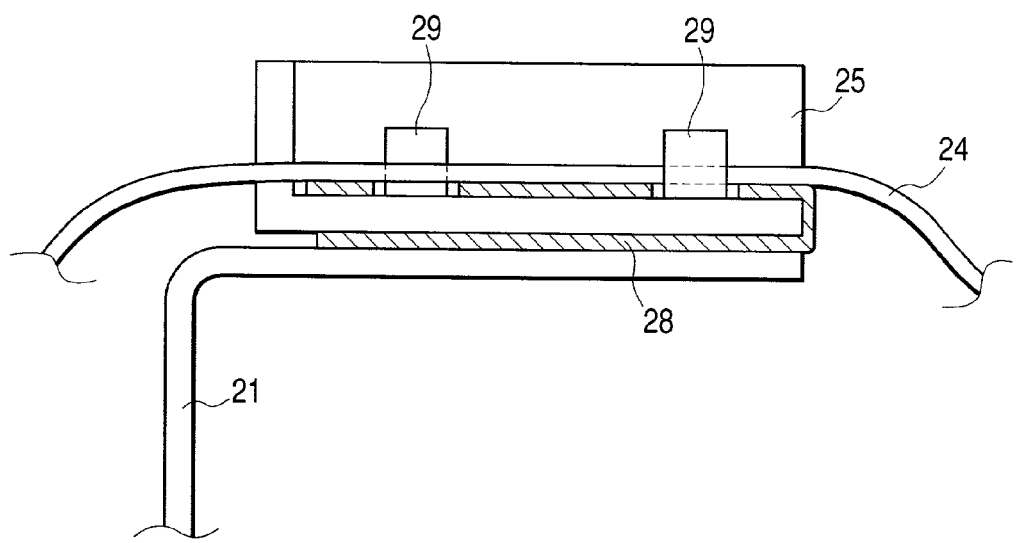
FIGS. 4A, 4B and 4C are explanatory views explaining the configuration of the holder of the embodiment of the present invention.

The electro-conductive sheet 28, as shown in FIG. 3 and FIG. 4A, is installed in such a manner as to go around from the side of the holder 30 to which the feed cable 24 is held to the side of the holder 30 that the metal frame 21 is contacted through a feed cable pressing member 29. In this manner, the feed cable 24 held by the holder 30 can be electrically connected to the metal frame 21.

When constituted in such a manner, the feed cable 24 is not brought into contact with the metal frame 21 and therefore is not damaged by the edge of the metal frame 21. Further, since the feed cable 24 is grounded to the metal frame 21 through the electro-conductive sheet 28, the electric noises are removed and have no influence on the images. Furthermore, being made of resin, the substrate can be obtained in a desired shape and is inexpensive, compared to being made of metal.

Here, a method of holding the feed cable 24 in the image forming apparatus according to the present embodiment will be described.

Figure 4B:
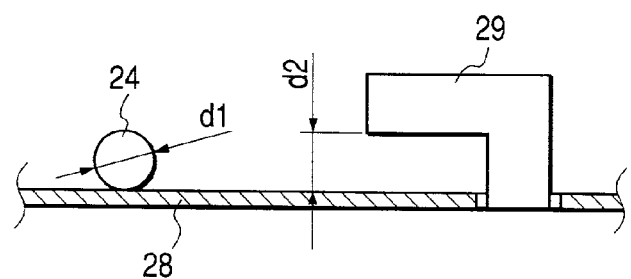

Between a gap d2 of the feed cable pressing member 29 of the holder 30 and a line diameter d1 of the feed cable 24, there exists a relationship of d2<d1 as shown in FIG. 4B and therefore, in a state in which the feed cable 24 is fitted with the pressing member 29, the feed cable 24 is pressed against the electro-conductive sheet 28. As a result, an earth can be securely taken between the feed cable 24 and the metal frame 21 through the electro-conductive sheet 28.

Figure 4C:
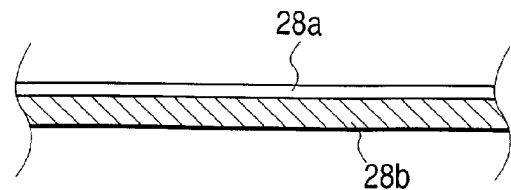
Figure 5:
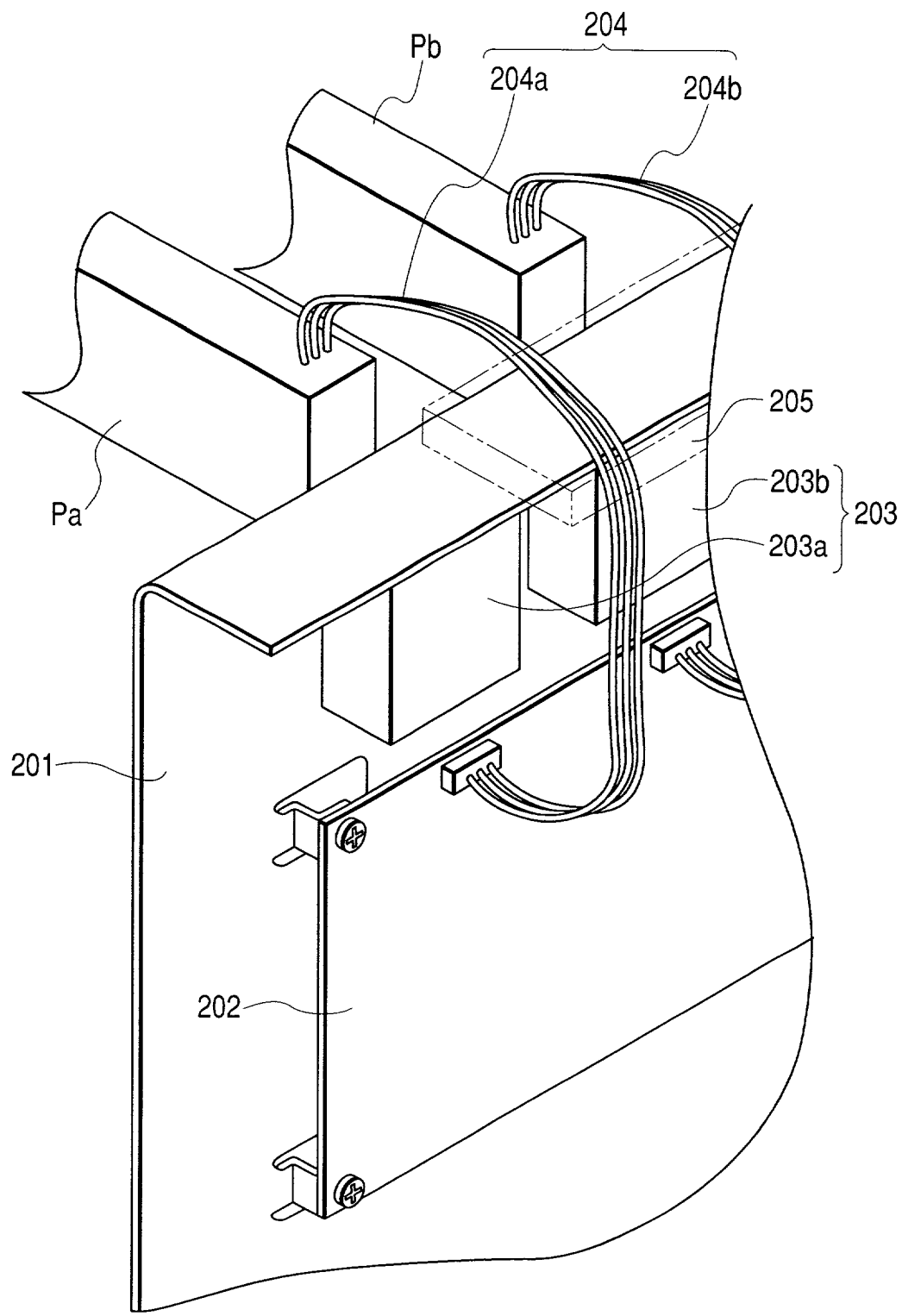
FIG. 5 is an explanatory view explaining the wiring of the conventional feed cable.
Figure 6A:
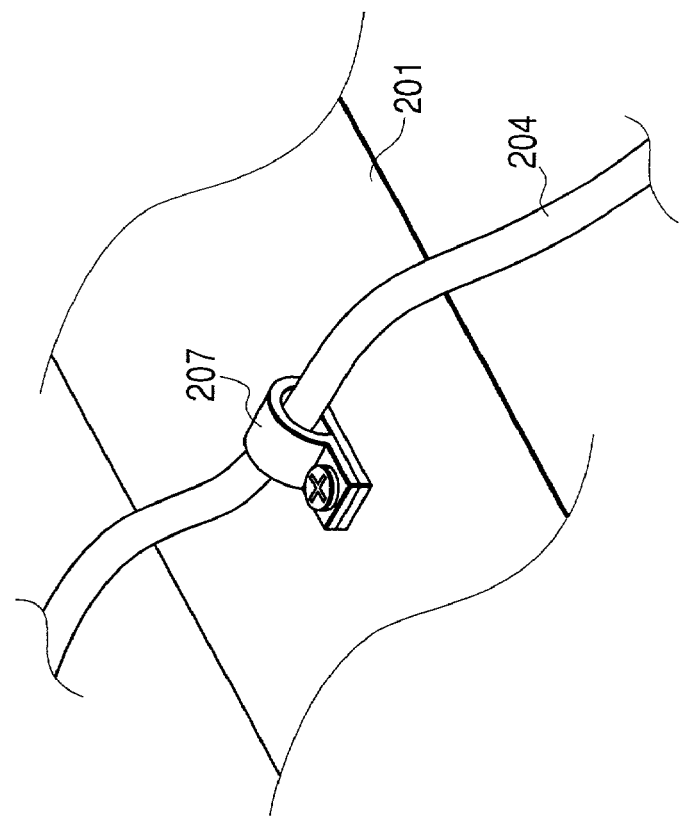
FIGS. 6A and 6B are explanatory views explaining a method of holding the feed cable.
Figure 6B:
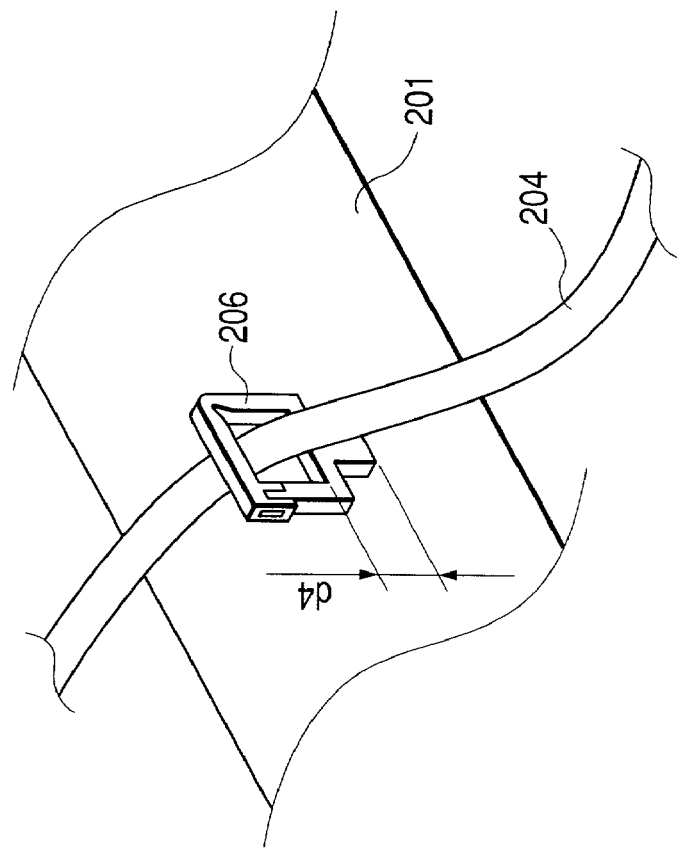

The electro-conductive sheet 28 is, as shown in FIG. 4C, divided into plural layers.

As an example of the layers constituting the electro-conductive sheet 28, a first combination can be enumerated as follows:

A first layer . . . a surface electro-conductive layer,
A second layer . . . an adhesive layer.
Or a second combination as follows:
A first layer . . . a surface electro-conductive layer,
A second layer . . . a resin layer.

Or a third combination as follows:
A first layer . . . a surface electro-conductive layer,
A second layer . . . a resin layer,
A third layer . . . an adhesive layer.

Having the adhesive layer is much easier in attaching the electro-conductive sheet 28 to the substrate 25 of the holder 30 and excellent in working performance. Having the resin layer reinforces the electro-conductive layer 28 and makes it easy to handle. Note that the electro-conductive sheet 28 made of any combination of the above described layers can be realized at relatively low cost. Further, in case of abolishing the image forming apparatus, removal of the sheet portion only of the holder 30 allows the remaining resin substrate 25 to be utilized once again. At this time, if the electro-conductive sheet 28 is installed in the resin substrate 25 in such a manner as to be easily peeled off, it can be more easily utilized.

Incidentally, in the present embodiment, for the sake of simplicity, a location of the holder 30 is limited, but the location is essentially not to be limited. Further, in the present embodiment, though the image forming apparatus comprising four image forming sections was employed, it is not limited to this configuration. Further, in the present embodiment, though lead wires of the image forming means are connected to the power source or the substrate, the connecting point is not limited to this.

The foregoing embodiments are included merely to aid in the understanding of the invention. However, it is to be understood that the invention is not intended to be limited to the embodiments, and variations may be made by skilled in the art without departing from the spirit and the scope of the invention.

What is claimed is:

1. An image forming apparatus that forms an image on a recording material, said image forming apparatus comprising:

an electrical board;
a unit, provided at a portion spaced from said electrical board, receiving current from said electrical board;
an electrical cable which electrically connects between said electrical board and said unit, wherein a surface of said electrical cable is insulated; and
an electrical cable holder having a resin member, a conductive sheet provided on the resin member and grounded, and a cable supporting member which supports said electrical cable to contact the surface of said electrical cable with the conductive sheet,
wherein said unit is an LED array which illuminates a light beam according to an image forming signal transmitted from said electrical board to the LED array with said electrical cable.

2. An image forming apparatus according to claim 1, wherein the electrical cable supporting member is integral with said electrical cable holder.

3. An image forming apparatus according to claim 1, wherein the resin member is grounded through a metal member of said image forming apparatus.

4. An image forming apparatus according to claim 1, wherein the electrical conductive sheet is removable from the resin member.

5. An image forming apparatus according to claim 1, wherein a high frequency electrical signal is transmitted to said unit with said electrical cable.

6. An image forming apparatus according to claim 1, wherein said electrical cable holder includes a plurality of electrical cable supporting members.

7. An image forming apparatus according to claim 1, wherein said electrical cable holder is capable of supporting a plurality of electrical cables.

* * * * *

UNITED STATES PATENT AND TRADEMARK OFFICE
CERTIFICATE OF CORRECTION

| | | |
|---|---|---|
| PATENT NO. | : 7,009,730 B2 | Page 1 of 1 |
| APPLICATION NO. | : 09/866664 | |
| DATED | : March 7, 2006 | |
| INVENTOR(S) | : Taro Ikeda | |

It is certified that error appears in the above-identified patent and that said Letters Patent is hereby corrected as shown below:

ON THE TITLE PAGE
Item (75), Inventor, "Shizouka" should read --Shizuoka--.

Item (57), Abstract, line 1, "a image" should read --an image--.

COLUMN 2
Line 28, "20 to" should read --20a to--.

COLUMN 4
Line 24, "by" should read --by those--.

Signed and Sealed this

Fourteenth Day of November, 2006

JON W. DUDAS
*Director of the United States Patent and Trademark Office*